United States Patent
Alpert et al.

(10) Patent No.: US 6,401,234 B1
(45) Date of Patent: Jun. 4, 2002

(54) METHOD AND SYSTEM FOR RE-ROUTING INTERCONNECTS WITHIN AN INTEGRATED CIRCUIT DESIGN HAVING BLOCKAGES AND BAYS

(75) Inventors: Charles Jay Alpert, Austin, TX (US); Rama Gopal Gandham, Wappingers Falls, NY (US); Jiang Hu, Tianjin (CN); Jose Luis Neves, Wappingers Falls, NY (US); Stephen Thomas Quay, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/465,294

(22) Filed: Dec. 17, 1999

(51) Int. Cl.[7] ............................................. G06F 17/50
(52) U.S. Cl. ..................................................... 716/13
(58) Field of Search ........................... 716/7, 9, 10–12, 716/13

(56) References Cited

U.S. PATENT DOCUMENTS 6,289,495 B1 * 9/2001 Raspopovic ................. 716/12
6,155,725 A1 * 12/2001 Scepanovic .................. 716/9

* cited by examiner

*Primary Examiner*—Matthew Smith
*Assistant Examiner*—Thuan Do
(74) *Attorney, Agent, or Firm*—Casimer K. Salys; Bracewell & Patterson, L.L.P.

(57) ABSTRACT

A method and system for re-routing interconnects within an integrated circuit design having blockages and bays is disclosed. A net within the integrated circuit design is initially decomposed into multiple two-paths. The net includes interconnects previously routed by utilizing a Steiner tree routing algorithm. Next, a cost associated with each of the two-paths is calculated. A two-path having a a high cost is subsequently selected and re-routed with a lower cost two-path.

21 Claims, 4 Drawing Sheets

METHOD AND SYSTEM FOR RE-ROUTING INTERCONNECTS WITHIN AN INTEGRATED CIRCUIT DESIGN HAVING BLOCKAGES AND BAYS

BACKGROUND OF THE INVENTION

1. Technical Field

The present invention relates to a method and system for data processing in general, and in particular to a method and system for routing interconnects within an integrated circuit design. Still more particularly, the present invention relates to a method and system for re-routing interconnects within an integrated circuit design having blockages and buffer bays.

2. Description of the Prior Art

As integrated circuits become increasingly smaller, the resistance per unit length of interconnect continues to increase, but the capacitance per unit length of interconnect remains almost constant while logic delay continues to decrease. If this trend continues, interconnect delay will become more dominant than logic delay in the near future.

Generally speaking, the characteristic interconnect delay of an interconnect is directly proportional to the square of the length of the interconnect. One approach to reducing interconnect delay is to insert buffers along the interconnect because buffer insertion effectively divides the interconnect into smaller segments, which makes the interconnect delay almost linear with respect to the length of the interconnect. Hence, buffer insertion has become a necessary step in modern integrated circuit designs.

A Steiner tree algorithm is commonly used to perform interconnect routing, and a buffer insertion algorithm is then used to insert buffers into the previously routed interconnect network. When inserting buffers into a previously routed interconnect network (especially a hierarchical one), a buffer typically cannot be placed on top of a pre-existing circuit macro known as a blockage. Thus, if the interconnect network was routed mostly over one or more blockages, then no buffer insertion algorithm that follows the conventional Steiner tree routing topology will be able to find a solution. Referring now to the drawings and in particular to FIG. 1a, there is illustrated an example of a two-pin net 10 whose Steiner tree route runs over a blockage 11, on top of which buffers cannot be placed. However, if two-pin net 10 is re-routed as shown in FIG. 1b, then buffers, such as b1 and b2, can be judiciously inserted on two-pin net 10, as depicted in FIG. 1c, albeit for an additional wire length cost.

In some design methodologies, instead of trying to restrict buffer insertions to certain locations between large blockages, it may be more suitable to pre-assign certain locations specifically for buffer placements. These pre-assigned locations specifically reserved for buffer placements are known as buffer bays. FIG. 2a shows an example of two-pin net 10 that does not pass through any buffer bays, such as a buffer bay 12, and is totally blocked from buffer insertions. By re-routing two-pin net 10 through buffer bay 12, as shown in FIG. 2b, buffers such as b3 and b4 can be suitably inserted into two-pin net 10, as shown in FIG. 2c.

The present disclosure provides an improved method and system for intelligently re-routing interconnects within an integrated circuit design that contains blockages and/or buffer bays.

SUMMARY OF THE INVENTION

In accordance with a preferred embodiment of the present invention, a net within an integrated circuit design is initially decomposed into multiple two-paths. The net includes interconnects previously routed by utilizing a Steiner tree routing algorithm. Next, a cost associated with each of the two-paths is calculated. A two-path having a high cost is subsequently selected and re-routed with a lower cost two-path.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

A. Problem Formulation

Figure 3:
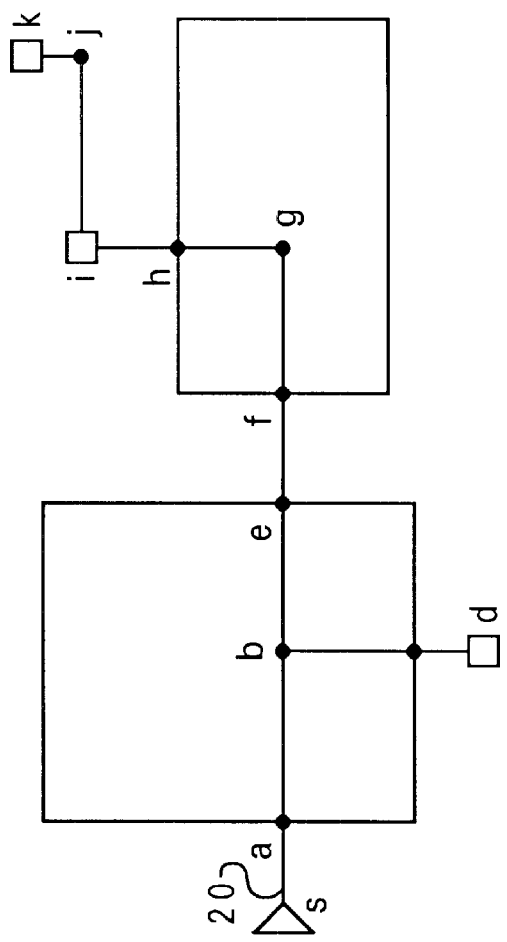
FIG. 3 depicts a Steiner tree route having a single source and multiple sinks.

Given a unique source so and a set of sinks SI, a rectilinear Steiner tree T(V,E) is a spanning tree in a rectilinear plane that connects every node in {so} u SI along with additional nodes. Let W be the set of these additional nodes, so that V={so} U SI U W. W may include three types of nodes: (i) internal Steiner nodes of degree three or four, denoted by a set IN, (ii) corner nodes of degree two that designate a path switch from a horizontal to a vertical direction, denoted by a set CO, and (iii) boundary nodes of degree two with one incident edge routed over blockages while the other avoids blockages, denoted by a set BY. For example, as shown in FIG. 3, there is depicted a Steiner tree route 20 having a source so=s and sinks SI={d,i,k}. All the other nodes are in W with b ∈ IN, g, j ∈ CO, and a, c, e, f, h ∈ BY.

Figure 1C:
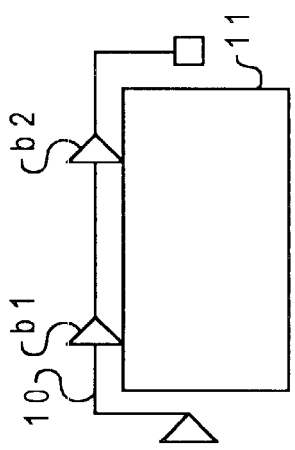
FIGS. 1a–1c illustrate an example of buffer insertions around a blockage.
Figure 2C:
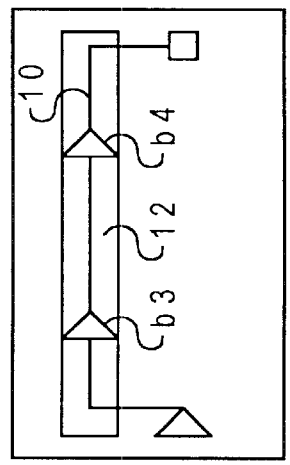
FIGS. 2a–2c illustrate an example of buffer insertions within a buffer bay.
Figure 1B:
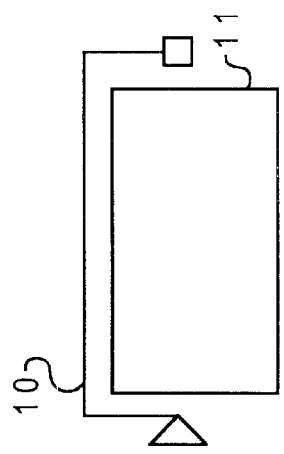
Figure 2B:
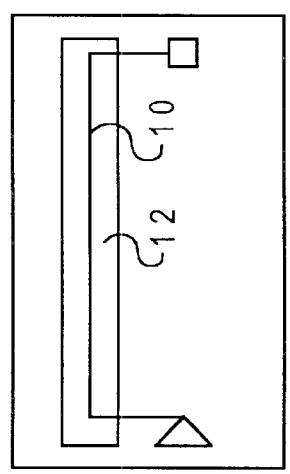
Figure 1A:
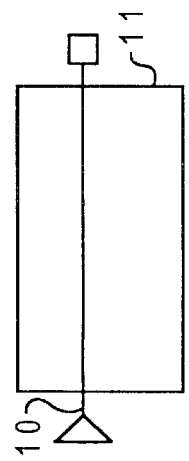
Figure 2A:
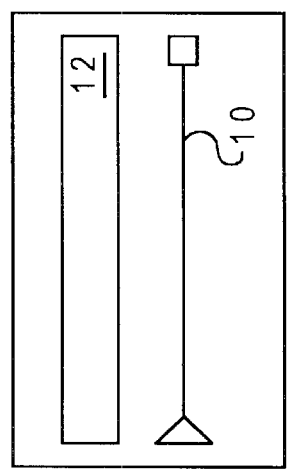

A rectangle r has a unique bounding coordinates $(x_1, y_1)$, $(x_2, y_2)$, whereby $x_1 \leq x_2$ and $y_1 \leq y_2$. Given a set of rectangular blockages B, an edge e ∈ E is defined to be inside B (denoted by e ∈ B) if there exists a rectangle r ∈ B such that both end points of e lie inside the bounding rectangle r. The preliminary cost function for the rectilinear Steiner tree T(V,E) is as follows:

$$\text{cost}(T(V, E)) = \sum_{e \in E} 1_e + \alpha \sum_{e \in B} 1_e \qquad (1)$$

where $1_e$ is the length of edge e. The parameter a represents the degree of the cost penalty for routing interconnects over blockage B. For example, when setting α=1 causes edges routed over blockage B to have twice the cost penalty over edges that avoid blockage B, then for the example in FIGS. 1a–1c, it is better to choose the route in FIG. 1a because the length of two-pin net 10 is more than double when changing the route from FIG. 1a to 1b. This is because even though doubling the interconnect length might have allowed buffer insertion, but it might not have reduced interconnect delay due to additional interconnect resistance and capacitance. A reasonable value for $\alpha$ can be deduced for a given processing technology. The cost function equation (1) can also be used to model buffer bays simply by considering the regions outside a buffer bay as blockages and inside the buffer bay as non-blockages.

One problem with the cost function equation (1), as with constructing Steiner minimal trees, is that some source-to-sink paths may become too long, and thus, interconnect delay may increase. A path $p(u,v)$ in $T(V,E)$ from u to v is an ordered subset of edges $\{(u, v_1), (v_1, v_2), \ldots, (v_m, v)\}$ in E. The length of a path $p(u,v)$ is given by $l_p(u,v) = \Sigma_{e \in p(u,v)} l_e$. The radius of T is given by $R(T) = \max_{v \in SI} l_{p(so,v)}$. Thus, given a source so, a set of sinks SI, and a set of rectangle blockages B, the Steiner Tree re-routing algorithm of the present invention constructs a Steiner tree $T(V,E)$ such that $\{so\} \cup SI \subseteq V$ and $$\text{cost}(T(V, E)) = \sum_{e \in E} 1_e + \alpha \sum_{e \in B} 1_e + \beta R(T) \tag{2}$$

is minimized.

B. Steiner Tree Re-routing Algorithm Description

1. Overview

A two-path of a Steiner tree $T(V,E)$ is defined as a path $p(u,v) \in T$, $\{(u,v_1), (v_1, v_2), \ldots, (v_m, v)\}$ such that $\{v_1, \ldots, v_m\} \subset BY \cup VO$ and $u \notin BY \cup CU$, $v \notin BY \cup CO$. Every Steiner tree $T(V,E)$ can be uniquely decomposed into multiple numbers of two-paths. For example, the Steiner tree shown in FIG. 3 can be decomposed into four two-paths: $p(s,b)$, $p(b,d)$, $p(b,i)$, and $p(i,k)$. Except for a two-node Steiner tree, the number of two-paths is equal to the total number of sinks and sources.

Figure 4:
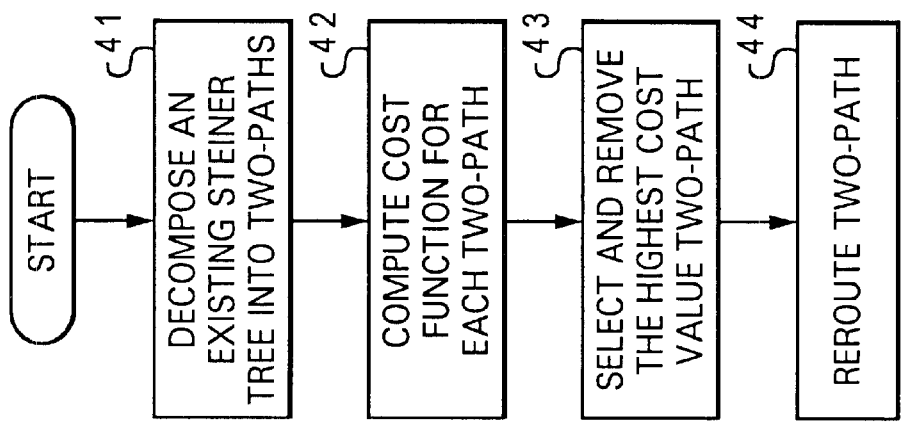
FIG. 4 is a high-level flow diagram of a method for re-routing interconnects within an integrated circuit design that contains blockages and/or buffer bays, in accordance with a preferred embodiment of the present invention.

With reference now to FIG. 4, there is depicted a high-level flow diagram of a method for re-routing interconnects within an integrated circuit design that contains blockages and/or buffer bays, in accordance with a preferred embodiment of the present invention. For each net within the integrated circuit design, the Steiner tree re-routing algo-rithm of the present invention begins by decomposing an existing (or original) Steiner tree into several disjointed two-paths, as shown in block 41. The Steiner tree re-routing algorithm then computes the cost penalty for each disjointed two-path, as depicted in block 42. The cost penalty for a two-path should reflect the cost function for the existing Steiner tree as closely as possible. Considering the choice for a tree cost function in equation (2), the cost function for a two-path $p(u,v)$ in Steiner tree $T(V,E)$ can be defined as follows:

$$\text{cost}(p(u, v)) = 1_{p(u,v)} + \alpha \sum_{e \in B \cap p(u,v)} 1_e \tag{3}$$

where $1_{p(u,v)}$ is the path length.

The Steiner tree re-routing algorithm then chooses a poorly routed two-path and removes the poorly routed two-path, as shown in block 43. The two-path with the highest cost value may not necessarily be the most poorly routed path because the highest cost value path can simply be a very long path. In a preferred embodiment, the two-path $p(u,v)$ with the highest value of $$\text{cost}(p(u,v)) \, 1_{p(u,v)} \tag{4}$$

is chosen to be re-routed. This choice is equivalent to choosing a two-path with the highest ratio of interconnect length routed over blockage(s) to total interconnect length. When this ratio is high, it is likely that the route of the two-path can be improved significantly. Finally, the Steiner tree re-routing algorithm re-routes the two-path, as depicted in block 44. The Steiner tree re-routing algorithm proceeds iteratively by selecting, removing, and re-routing two-paths in this manner for each net within the integrated circuit design. A pseudo-code description of the Steiner tree re-routing algorithm is given in Table I.

TABLE I

Procedurer Steiner_tree(T, B)

input: a Steiner tree, T(V, E), a set of rectangles B representing buffer blockages or bays
output: a re-routed Steiner tree T
1. G = Grid_graph(T, B) (see Table II for details)
2. compute the set P of disjointed two-paths in T
3. compute the cost penalty of each two-path in P from equation (4).
4. while P≠0
5. choose p(u, v) ∈ P such that cost(p(u, v))/l$_{p(u, v)}$ is maximized.
6. remove p(u, v) from T, thereby creating two sub-trees,
   set in Tree(e) = false for each e ∈ p(u, v); label subtree with so as T$_s$ and the other
   as T$_t$ on G.
7. find a two-path p(q, w) = Maze_routing (G, T$_s$, T$_t$).
8. re-connect T$_s$ and T$_t$ with two-path p(q, w), set in Tree(e) = true for each e ∈ p(q, e).

According to the Steiner_tree procedure shown in Table I, the underlying grid-graph is computed for T and B, as shown in step 1. Then, the set of disjointed two-paths is found, as shown in step 2; and steps 3–4 iterate through these two-paths, each time picking the one two-path with the highest cost penalty. The two-path having the highest cost penalty is subsequently removed, as depicted in step 5, inducing two subtrees T$_s$ and T$_t$. Next, the maze routing is performed, as shown in step 6, returning a minimum cost two-path between $T_s$ and $T_r$. The tree is finally re-connected using the minimum cost two-path, as depicted in step 7. The minimum cost two-path between subtrees is computed by maze routing, which will be described infra.

2. Grid-graph Construction

The Steiner tree heuristic of the present invention is based on maze routing that can handle several cost functions and scenarios. Fundamental to maze routing is the concept of a grid graph, G ($V_G$, $E_G$).

A grid graph can be viewed as a tessellation of rectangular tiles with $V_G$ being the set of tile centers, and $E_G$ being edges that connect the tile centers. A grid graph can be uniquely induced by the sets $X=\{x_1, \ldots, x_n\}$ and $Y=\{y_1, \ldots, y_n\}$ of sorted non-duplicate coordinates. The vertices V for the corresponding grid graph G($V_G,E_G$) are given by $V_G=\{(x,y) | x \in x, y \in y\}$. The edges are given by $E_G=\{((x_i,y), (x_{i+1}, y)) | 1 \leq i < |X|, y \in y\} \cup \{((x,y_i), (x, y_i+1) | 1 \leq i < |Y|, x \in x\}$.

Instead of utilizing a uniform grid-graph, a non-uniform grid graph is preferably utilized for the present invention. A non-uniform grid graph allows high density channels in difficult routing areas and low density channels elsewhere. In accordance with a preferred embodiment of the present invention, a non-uniform grid graph is constructed according to the grid_graph procedure shown in Table II.

X and Y are generated steps 4–5. Finally, each edge in G is labelled with the following two properties:

Property 1: Whether or not the edge is currently in T, i.e., the coordinates of the grid-graph edge are identical to or are fully contained within some edge e in T. If e is such an edge then inTree(e)=true and false otherwise; and Property 2: Whether or not the edge overlaps blockage as given by B. An edge e which cannot allow buffers to be inserted on has label blocked(e) set to true and to false otherwise.

Figure 5:
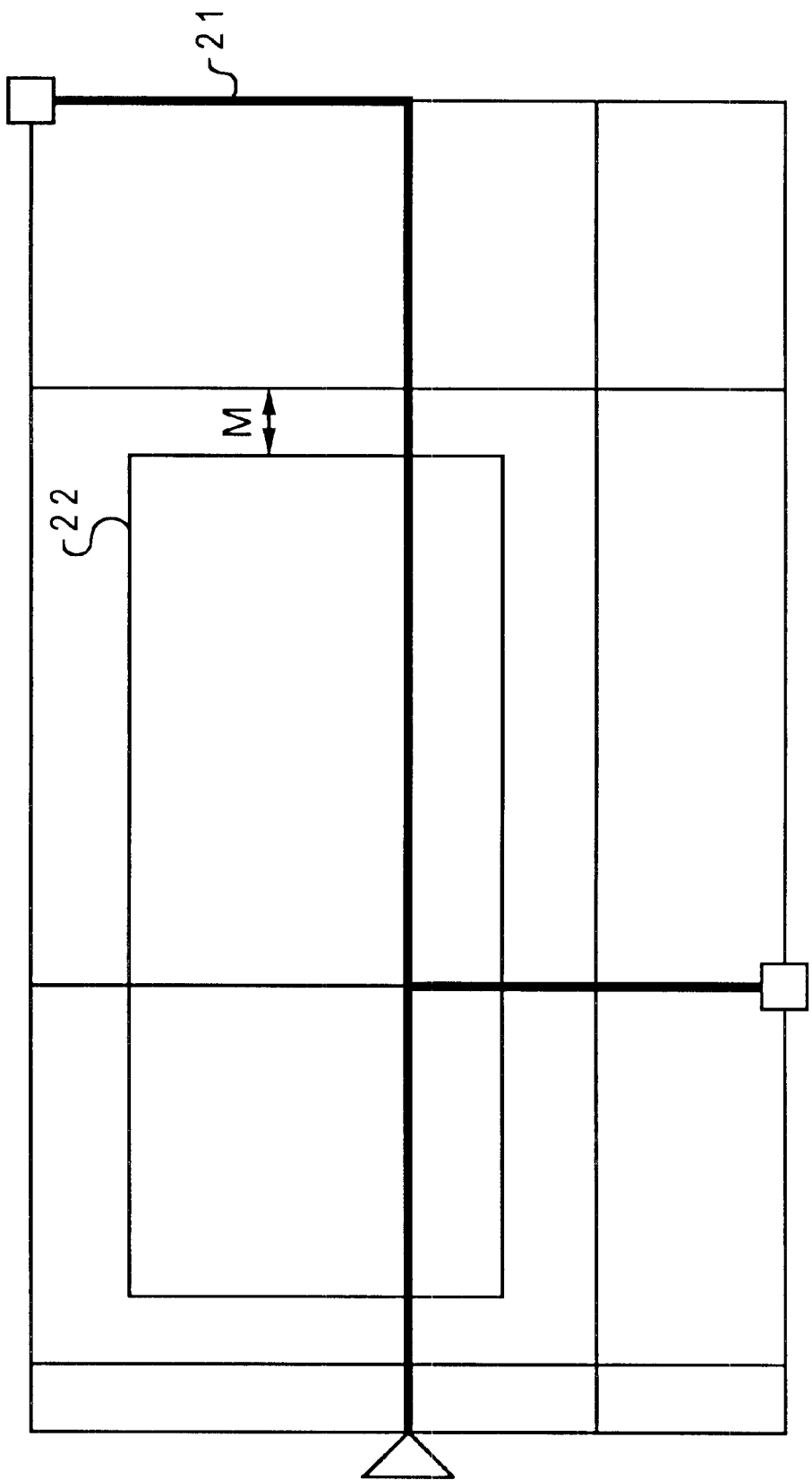
FIG. 5 is an exemplary grid-graph constructed for a three-pin net with a single blockage, utilizing a $grid_{13}$ graph procedure in accordance with a preferred embodiment of the present invention.

An exemplary grid graph constructed according to the grid_graph procedure of Table II for a three-pin net 21 with a single blockage 22 is shown in FIG. 5.

3. Maze Routing

The minimum cost path joining two subtrees can be found by a maze routing algorithm. The maze routing algorithm is designed to connect two points, and it runs on a grid-graph. Grid edges are the only legal candidates for any routing path. Each grid edge is assigned a cost value, commonly the edge length (and blocked edges have infinite cost). The cost value of a source node is first labeled to be zero, and then wave expansion proceeds out from the source node, labeling all intermediate nodes until the target node is reached. The grid

TABLE II

Procedure grid_graph(T, B)

input: minimum Steiner Tree T(V, E); a set of rectangles B
output: Grid graph G($V_G$, $E_G$)
1. set X = 0, Y = 0.
2. for each v ∈ V with coordinates (x, y), add x to X and add y to Y.
3. for each rectangle r ∈ B with bounding box ($x_1$, $y_1$), ($x_2$, $y_2$)
   if r is a block
      insert $x_1$ – M, $x_2$ + M in X and $y_1$ – M, $y_2$ + M in Y.
   if r is a buffer bay
      insert $x_1$ + M, $x_2$ – M in X and $y_1$ + M, $y_2$ – M in Y.
4. sort the coordinates in X and Y and remove duplicates.
5. generate grid notes $V_G$ and grid edges $E_G$ from X and Y.
6. for each edge e ∈ $E_G$, compute values for properties in Tree(e) and blocked (e).

According to the grid_graph procedure shown in Table II, both X and Y are initially set to zero, as shown in step 1. Then, the coordinates of each tree node are added into X and Y, as depicted in step 2. Next, the coordinates of blockages are added, as shown in step 3, and the grid-graph induced by node labels reflects the cost value from the source node. For a linear cost function, the maze routing algorithm guarantees the least cost path for connecting two points. A complete description of the maze routing algorithm is described in Table III.

TABLE III

Procedure maze_routing(G, $T_s$, $T_t$)

input: underlying grid graph G($V_G$, $E_G$); two disjoint Steiner tree $T_s$ and $T_t$ embedded in G
output: two-path p(q, w) with q ∈ $T_s$, w ∈ $T_1$
1. for each grid node v ∈ $V_G$, set label (v) = ∞ and visted (v) = false.
2. for each node v ∈ $T_s$
   Set label (v) = 0 and insert v into grid node set Q.
3. while Q ≠ 0
4. let v be the grid node in Q with minimum label (v). Delete v from Q.
   set visit (v) = true
5. For each node u, such that (u, v) ∈ $E_G$, new Label = label(v) + l(u, v).
   If blocked (u, v) then new Label = new Label + α l (u, v)
6. if new Label < label(u) then label(u) = new Label. Set parent(u) = v,
7. if visited(u) = false and u ∈ $T_1$, insert u into Q.
8. find node w ∈ $T_t$ such that label (w) is minimum.
9. find the path from w to a node q ∈ $T_s$ by tracing back parent. Return this pat p(q, w).

According to the maze_routing procedure shown in Table III, two arrays, label ( ) and visited ( ), are initialized for each node in the grid-graph, as shown in step 1. The label (v) value is cost of the best path from a node in $T_s$ to v, and the visited(v) value reveals whether v has been explored in the maze routing search. Next, the labels of all nodes in $T_s$ are initialized to zero and are put into a node set Q, as depicted in step 2. Node set Q is implemented as a priority queue gives the most efficient run time. The grid-graph is then searched by iteratively deleting the node v with smallest label from node set Q and exploring that node, as shown in steps 3–7. Each neighbor node u of v are explored in steps 5–6, and the label for u is updated according to length of edge (u,v) and whether edge (u,v) is blocked. If the new label by first visiting v is less than the previous label for u, the label is updated and v becomes the parent for u. Then, the node with smallest label in the target tree is found, as shown in steps 8–9, and uncovers the path back to the source tree by following the parent array. The path found is then returned.

D. Complexity Analysis

Given a Steiner tree T(v,E) and a set of blockages B, let n=|v| and k=|B|. The number of nodes and edges in the grid graph construed is $O((n+k)^2)$. If Q is implemented as a priority queue in the maze_routing procedure, then the maze_routing procedure has complexity $O((n+k)^2 \log(n+k))$. The number of times the maze_routing procedure is called by the Steiner_tree procedure is the same as the number of two-paths in T, which is bounded by O(n). Thus, the complexity for the entire Steiner tree re-routing algorithm is $O(n(n+k)^2 \log(n+k))$.

As has been described, the present invention provides a method and system for routing interconnects within an integrated circuit design having blockages and/or buffer bays. In response to a general Steiner tree problem formulation for the application of buffer insertion with either blockage and/or bay constraints, the present invention provides an improved Steiner tree re-construction methodology that derives a heuristic solution. The present invention iteratively selects and removes a sub-path of an existing Steiner tree and re-connects the two remaining sub-trees. A maze routing heuristic is used to achieve the lowest possible cost for this re-connection.

E. Computational Equipment

The present invention may be executed in a variety of computers under a number of different operating systems. The computer may be, for example, a personal computer, a mid-range computer or a mainframe computer. In addition, the computer may be a stand-alone system or part of a network such as a local-area network (LAN) or a wide-area network (WAN). For the purpose of illustration, a preferred embodiment of the present invention, as described below, is implemented on an RS/6000™ computer, manufactured by International Business Machines Corporation of Armonk, N.Y.

Figure 6:
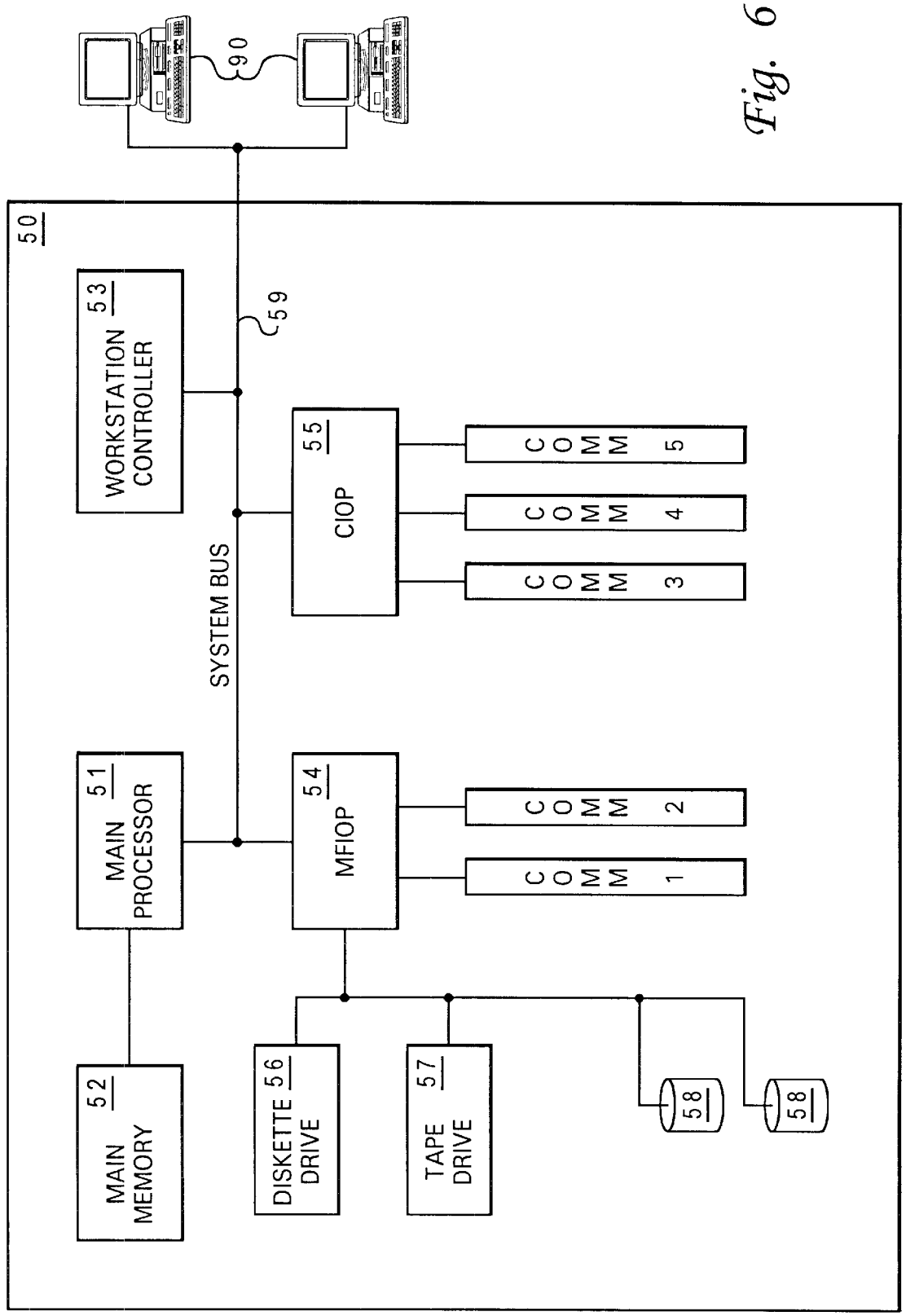
FIG. 6 is a block diagram of a computer system in which a preferred embodiment of the present invention can be executed.

With reference now to FIG. 6, there is illustrated a block diagram of a computer system in which a preferred embodiment of the invention can be executed. Within computer box 50, main processor 51 is coupled to a main memory 52 and a multiple-function I/O processor (MFIOP) 54. Main processor 51 may include a single processor or multiple processors. Several peripheral storage devices such as diskette drive 56, tape drive 57, and direct access storage devices (DASDS) 58, are controlled by MFIOP 54. In addition, MFIOP 54 provides communications to other devices via communication ports such as COMM 1 and COMM 2.

Attached to system bus 59 are a workstation con-troller 53 and a communications I/O processor (CIOP) 55. Workstation controller 53 provides communications between main processor 51 and workstation(s) 60 that may be connected to the computer system. CIOP 55 provides communications to other devices via communication ports such as COMM3, COMM4, and COMM5.

It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for routing interconnects within an integrated circuit design having blockages or buffer bays, said method comprising the steps of:

decomposing a net of an integrated circuit design into a plurality of two-paths, wherein said net includes interconnects previously routed by utilizing a Steiner tree routing algorithm;

calculating a cost associated with each of said plurality of two-paths;

selecting a two-path exceeding a threshold high cost; and re-routing said selected two-path with a lower cost two-path.

2. The method according to claim 1, wherein said calculating step further includes a step of calculating a ratio of an interconnect length routed over a blockage to a total interconnect length.

3. The method according to claim 1, wherein said lower cost two-path is computed by maze routing.

4. The method according to claim 3, wherein said method further includes a step of constructing a non-uniform grid-graph for said maze routing.

5. The method according to claim 1, wherein said selecting step further includes selecting a two-path having a highest cost.

6. The method according to claim 1, wherein said lower cost two-path is a two-path having a minimum cost.

7. The method according to claim 1, wherein each of said plurality of two-paths is a set of interconnects that are connected such that every internal node is a degree two node and every external node is not a degree two node.

8. A computer system for routing interconnects within an integrated circuit design having blockages or buffer bays, said computer system comprising:

means for decomposing a net of an integrated circuit design into a plurality of two-paths, wherein said net includes interconnects previously routed by utilizing a Steiner tree routing algorithm;

means for calculating a cost associated with each of said plurality of two-paths;

means for selecting a two-path exceeding a threshold high cost; and means for re-routing said selected high cost two-path with a lower cost two-path.

9. The computer system according to claim 8, wherein said calculating means further includes a means for calculating a ratio of an interconnect length routed over a blockage to a total interconnect length.

10. The computer system according to claim 8, wherein said lower cost two-path is computed by maze routing.

11. The computer system according to claim 7, wherein said computer system further includes a means for constructing a non-uniform grid-graph for said maze routing.

12. The computer system according to claim 8, wherein said means for selecting further includes means for selecting a two-path having a highest cost.

13. The computer system according to claim 8, wherein said lower cost two-path is a two-path having a minimum cost.

14. The computer system according to claim 8, wherein each of said plurality of two-paths is a set of interconnects that are connected such that every internal node is a degree two node and every external node is not a degree two node.

15. A computer program product residing on a computer usable medium for routing interconnects within an integrated circuit design having blockages and buffer bays, said computer program product comprising:

program code means for decomposing a net of an integrated circuit design into a plurality of two-paths, wherein said net includes interconnects previously routed by utilizing a Steiner tree routing algorithm;

program code means for calculating a cost associated with each of said plurality of two-paths;

program code means for selecting a two-path exceeding a threshold high cost; and program code means for re-routing said selected high two-path with a lower cost two-path.

16. The computer program product according to claim 15, wherein said program code means for calculating further includes a program code means for calculating a ratio of an interconnect length routed over a blockage to a total interconnect length.

17. The computer program product according to claim 15, wherein said lower cost two-path is computed by maze routing.

18. The computer program product according to claim 17, wherein said computer program product further includes a program code means for constructing a non-uniform grid-graph for said maze routing.

19. The computer program product according to claim 15, wherein said program code means for selecting further includes program code means for selecting a two-path having a highest cost.

20. The computer program product according to claim 15, wherein said lower cost two-path is a two-path having a minimum cost.

21. The computer program product according to claim 15, wherein each of said plurality of two-paths is a set of interconnects that are connected such that every internal node is a degree two node and every external node is not a degree two node.

* * * * *